US009282641B2

(12) United States Patent
Liu

(10) Patent No.: US 9,282,641 B2
(45) Date of Patent: Mar. 8, 2016

(54) PRECISELY SPLICED FOLDABLE LED SCREEN

(71) Applicant: Yanping Liu, Guangdong (CN)

(72) Inventor: Yanping Liu, Guangdong (CN)

(*) Notice: Subject to any disclaimer, the term of this patent is extended or adjusted under 35 U.S.C. 154(b) by 28 days.

(21) Appl. No.: 14/478,699

(22) Filed: Sep. 5, 2014

(65) Prior Publication Data

US 2016/0014899 A1    Jan. 14, 2016

(30) Foreign Application Priority Data

Jul. 10, 2014  (CN) .......................... 2014 1 0327331

(51) Int. Cl.
| H05K 1/00 | (2006.01) |
| H05K 1/14 | (2006.01) |
| H05K 1/02 | (2006.01) |
| H05K 5/00 | (2006.01) |

(52) U.S. Cl.
CPC .............. *H05K 1/147* (2013.01); *H05K 1/0281* (2013.01); *H05K 5/0017* (2013.01)

(58) Field of Classification Search
CPC . F21Y 2101/02; G02B 6/0068; G06F 1/1616; G06F 1/1637; G06F 1/1641
USPC .................. 361/749, 679.02, 679.21, 679.26, 361/679.29; 174/254–258; 362/249.01–249.04, 249.09
See application file for complete search history.

(56) References Cited

U.S. PATENT DOCUMENTS

| 7,121,687 | B2* | 10/2006 | Sidwell | ..................... F21K 9/00 362/121 |
| 7,517,101 | B2* | 4/2009 | Tobin | ................... A61N 5/0616 362/1 |
| 7,726,839 | B2* | 6/2010 | Chien | .................... H04N 7/181 362/249.03 |
| 8,662,705 | B2* | 3/2014 | Roberts | ..................... A61L 2/10 362/249.02 |
| 2010/0064536 | A1* | 3/2010 | Caskey | ................. G06F 1/1616 33/303 |
| 2012/0182755 | A1* | 7/2012 | Wildner | ................. F21S 4/003 362/555 |
| 2012/0307423 | A1* | 12/2012 | Bohn | .................... G06F 1/1641 361/679.01 |

* cited by examiner

Primary Examiner — Tuan T Dinh
Assistant Examiner — Hung Dang
(74) Attorney, Agent, or Firm — Tim Tingkang Xia, Esq.; Locke Lord LLP

(57) ABSTRACT

The present invention discloses a precisely spliced foldable LED screen, comprising a screen formed by subscreens arranged vertically and horizontally; a steel cable arranged at the back of the subscreen and formed by long and short steel wires connected in a spacing manner on the vertical direction; and fixing seats arranged at the back of the subscreens and used for containing the connected parts of the long and short steel wires. According to the present invention, the fixing seats are arranged at the back of the subscreen, and the subscreens are connected in series through the connection between the steel cable and the fixing seats, thus realizing connection and fixation between the subscreens. The precisely spliced foldable LEC screen enables the subscreens to be installed and replaced more flexibly and conveniently.

9 Claims, 7 Drawing Sheets

PRECISELY SPLICED FOLDABLE LED SCREEN

CROSS-REFERENCE TO RELATED APPLICATIONS

This non-provisional application claims priority under 35 U.S.C. §119(a) on Patent Application No(s). 201410327331.6 filed in P.R. China on Jul. 10, 2014, the entire contents of which are hereby incorporated by reference.

TECHNICAL FIELD

The present invention relates to a LED display screen, and in particular, to a precisely spliced foldable LED screen.

BACKGROUND ART

A display screen is a display tool that displays a certain electronic document onto a screen and then reflects the electronic document to human eyes through a specific transmission device. The display screen usually displays through controlling a semiconductor light emitting element and displays various image information through the on-off of the light emitting element.

Soft LED display screens and folded display screens in the present market have the defects of difficult site maintenance, difficult loading and unloading, complicated connecting operability of unit modules and the like, for example: 1. when a certain unit module of the folded display screen in the prior art has negative phenomenon and needs to be replaced, other structures in the screen need to be dismounted, the work of replacing the unit module cannot be independently finished by one person, and the replacing time is long, which greatly affects the practical applicability of the folded display screen; 2. all the adjacent unit modules of the existing folded display screen have gap due to the influence of the folding structure thereof, thus affecting the entire display effect of the folded display screen.

Therefore, how to design a foldable LED screen which is convenient to assemble and disassemble, precisely spliced and has good display effect is a technical problem that needs to be urgently solved in the industry.

SUMMARY OF THE INVENTION

In order to solve the existing problems, the present invention provides a foldable LED screen which is convenient to assemble and disassemble, precisely spliced and has good display effect.

A precisely spliced foldable LED screen of the invention, comprising:
- a screen, formed by at least one group of subscreens arranged vertically;
- a steel cable, arranged at the back of the subscreen, comprising: a long steel wire and a short steel wire which are vertically connected in a spacing manner and have the same diameter, wherein the two ends of the long steel wire and the short steel wire are respectively provided with a square fixture block; the square fixture block is of a concave shape; the end of the steel wire is fixed on the bottom at one side of the fixture block; the upper part of the fixture block is provided with a through groove; the steel wire may be matched and clamped into the groove; the adjacent ends of the long and short steel wires are mutually and alternatively spliced together through the fixture block; and
- fixing seats, wherein the fixing seat comprises: a base, wherein a square concave hole is arranged on the base, one corner of the concave hole is provided with a convex block having an installing hole, the center at the bottom of the concave hole is provided with a long slot, a sliding block is arranged in the sliding slot, and the base is provided with a sliding slot at the two sides of one end of the concave hole; a cover plate which may slide along the sliding slot to cover or open the square concave hole; a spring arranged in the square concave hole of the base, wherein one end of the spring is inserted into the installing hole of the convex block, and the other side is connected with the cover plate through a screw and the sliding block; a fixing slot arranged at one side of the base and vertical to the sliding direction of the cover plate, wherein slot openings matched with the long and short steel wires are respectively extended out from the two ends of the hole of the fixing slot; and a fixing lug stretching out from the two ends of the base and provided with a screw hole;
- the fixing seat is arranged on the upper and lower ends of the back of the subscreen, and the fixing slot of the fixing seat is vertically arranged; the spacing between the upper and lower fixing seats is matched with the length of the long steel wire; the spacing between two vertically adjacent fixing seats on the two subscreens are matched with the length of the short steel wire; the fixture block at the connected part of the long and short steel wires is clamped into the fixing slot and the steel wires stretch out from the slot opening.

In one embodiment, The screen comprises multiple groups of subscreens arranged vertically; the horizontally adjacent sides of each subscreen are also provided with the fixing seat on which the fixing slot is arranged horizontally; the spacing between the horizontally adjacent fixing seats on two subscreens is matched with the length of the short steel wire; and the square fixture block of the short steel wire is matched and clamped into the fixing slot.

The four corners of the subscreen are respectively provided with magnets.

The plug-in flat cables capable of matching for splicing are arranged on the adjacent sides at the back of the subscreens; moreover, welding flat cables are also arranged on the adjacent sides at the back of the subscreens.

The adjacent sides at the back of the two subscreens are respectively provided with an EVA form, wherein the adjacent sides of the two EVA foams are butted against and cover the gap between the two subscreens.

The back of the screen is provided with a cabling channel matched with the shape of the steel cable, and an installing slot matched with the shape of the fixing seat.

The inside of the cabling channel is provided with wire crimping buckles stretching out from one side towards the other side, and the adjacent wire crimping buckles are arranged towards opposite directions.

The top end of the steel cable is provided with a circular ring; the circular ring is installed and fixed through a conical nut and a stud; and the conical surface of the conical nut compresses the circular ring.

Compared with the prior art, fixing seats are arranged at the back of the subscreens of the present invention. The subscreens are connected in series through a manner of alternatively splicing fixture blocks of long and short steel wires, so that the fixed subscreens may be folded rationally. A steel cable connecting structure for fixing the subscreens is designed skillfully, which is convenient to install and replace the subscreens. In addition, the side edge of the back of the subscreen is also provided with EVA foam. The EVA foam not only can cover the gap to not transmit light, but also does not affect folding, thus effectively improving the visual effect. Furthermore, the four corners of the subscreen are provided with magnets. When multiple subscreens on the vertical and longitudinal directions are spliced, the magnets mutually attract, which may prevent the corners of the subscreens from warping and make the surface of the screen flat.

BRIEF DESCRIPTION OF THE DRAWINGS

The present invention is further described in details by reference to the accompanying drawings and specific embodiments hereunder, wherein in the drawings.

DETAILED DESCRIPTIONS OF THE PREFERRED EMBODIMENTS

Figure 1:
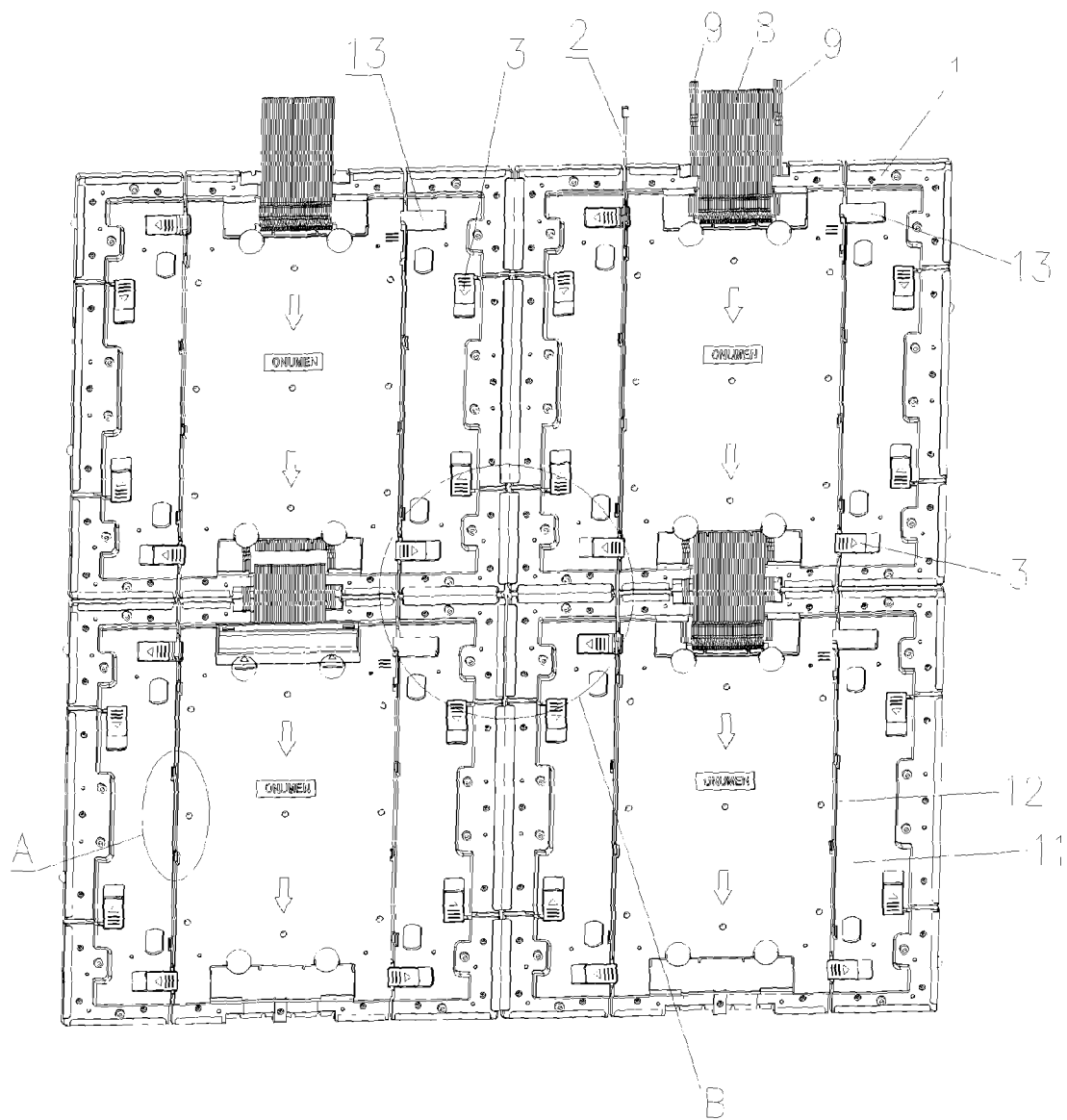
FIG. 1 is a structural schematic diagram of the back of the present invention.

As shown in FIG. 1, the foldable LED screen provided by the present invention comprises: a screen 1, a steel rope 2 and fixing seats 3. The screen 1 comprises at least one group of subscreens 11 arranged vertically and a steel rope 2 arranged at the back of the subscreen and used for fixing.

Figure 2:
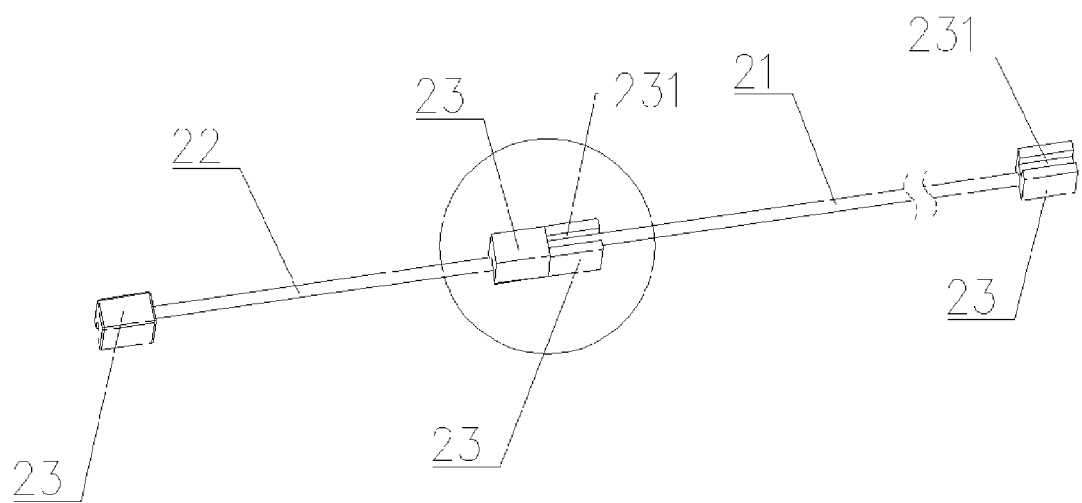
FIG. 2 is a structural schematic diagram of a steel cable of the present invention.
Figure 3:
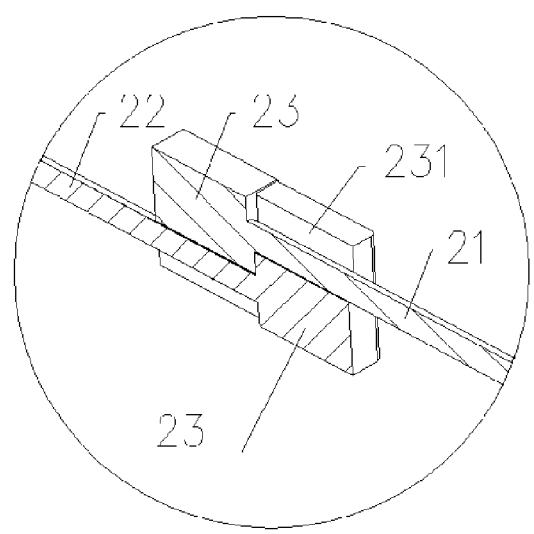
FIG. 3 is a schematic diagram of a partial section of a spliced end of FIG. 2.

As shown in FIG. 2 and FIG. 3, the steel rope 2 is arranged at the back of the subscreen 11, comprising: a long steel wire 21 and a short steel wire 22 which are vertically connected in a spacing manner and have the same diameter, wherein the two ends of the long steel wire and the short steel wire are respectively provided with a square fixture 23. The square fixture block is of a concave shape; the end of the steel wire is fixed on the bottom at one side of the fixture block; the upper part of the fixture block is provided with a through groove; the steel wire may be matched and clamped into the groove; and the adjacent ends of the long and short steel wires are mutually and alternatively spliced together through the fixture block.

Figure 4:
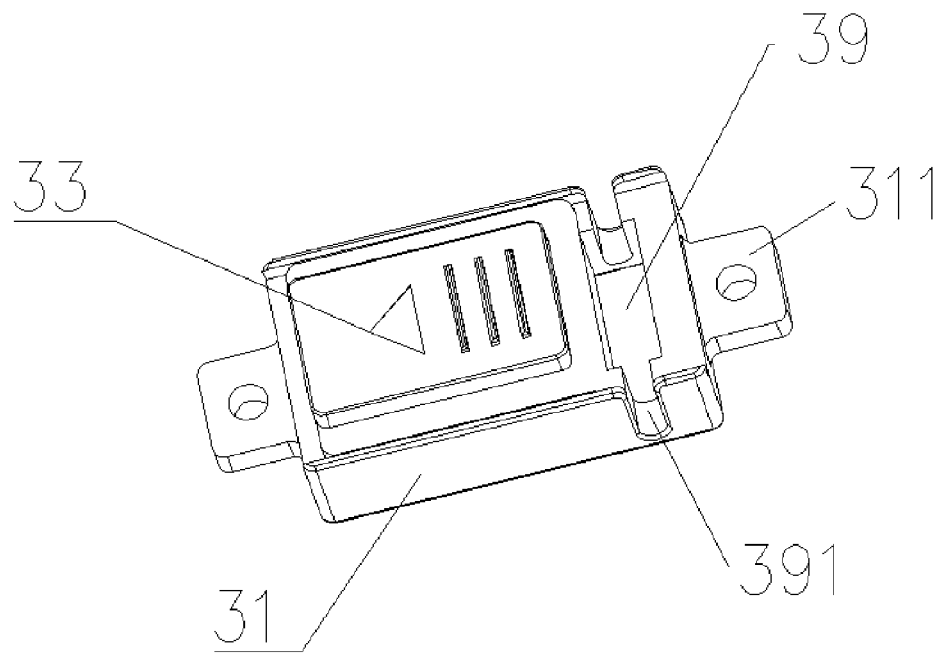
FIG. 4 is a schematic diagram of opening a fixing seat of the present invention.
Figure 5:
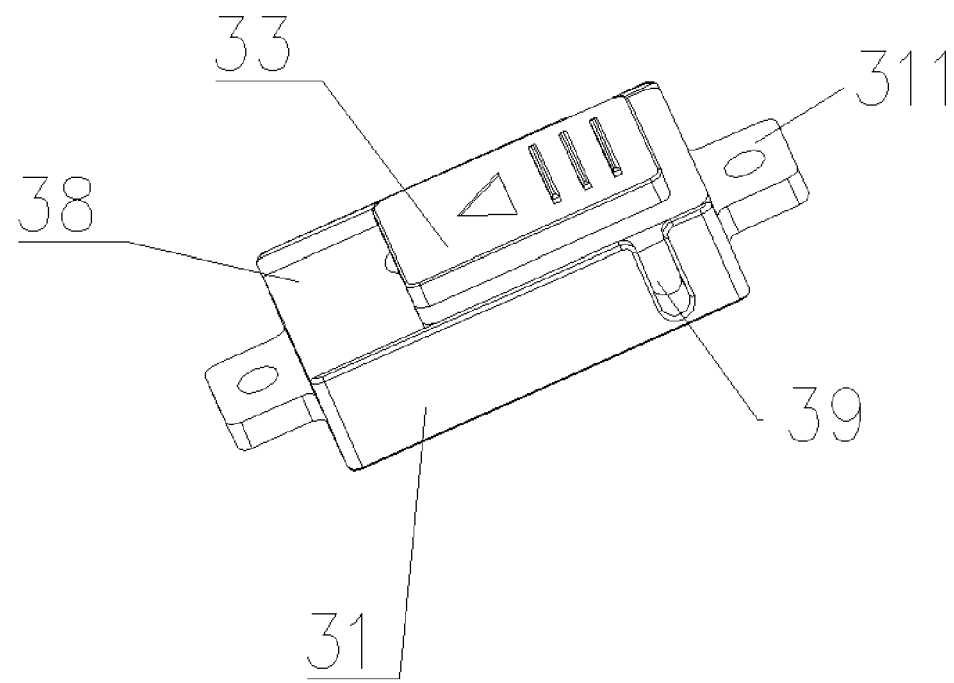
FIG. 5 is a schematic diagram of closing the fixing seat of the present invention.
Figure 6:
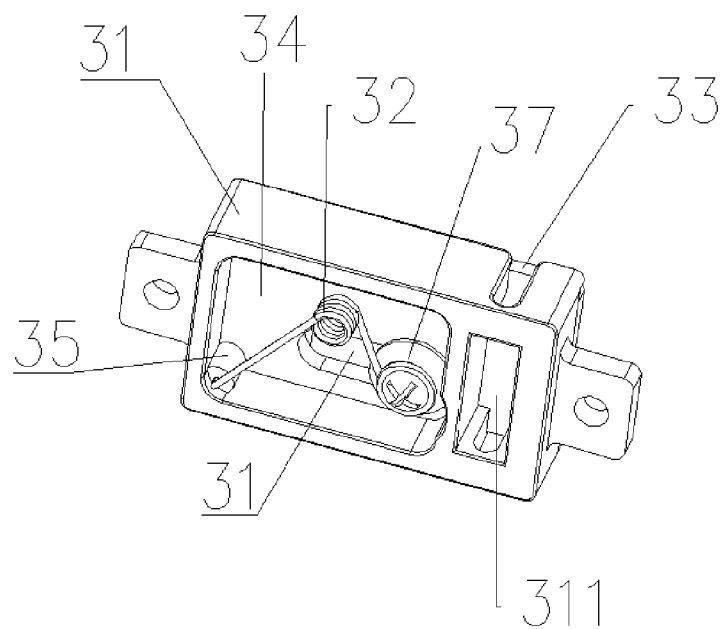
FIG. 6 is a structural schematic diagram of the back of the fixing seat of the present invention.

As shown in FIG. 4 to FIG. 6, the fixing seat 3 comprises: a base 31, wherein a square concave hole 34 is arranged on the base, one corner of the concave hole is provided with a convex block 35 having an installing hole, the center at the bottom of the concave hole is provided with a long slot 36, a sliding block 37 is arranged in the sliding slot, and the base is provided with a sliding slot 38 at the two sides of one end of the concave hole; a cover plate 33 which may slide along the sliding slot 38 to cover or open the square concave hole; a spring 32 arranged in the square concave hole of the base, wherein one end of the spring is inserted into the installing hole of the convex block 35, and the other side is connected with the cover plate 33 through a screw and the sliding block 37; a fixing slot 39 arranged at one side of the base and vertical to the sliding direction of the cover plate 33, wherein slot openings 391 matched with the long and short steel wires are respectively extended out from the two ends of the hole of the fixing slot; and a fixing lug 311 stretching out from the two ends of the base 31 and provided with a screw hole;

When in use, as shown in FIG. 2 and FIG. 3, the long and short steel wires in the steel rope 2 are alternatively spliced in series together through the fixture block 23. As shown in FIG. 4, the cover plate 33 is pushed away to insert the spliced part of the two steel wires into the fixing slot 39 of the fixing seat. When the cover plate 33 is loosened, the cover plate 33 restores to the home position along the sliding slot 38 under the effect of a spring force and compresses the spliced part in the fixing slot 39 (as shown in FIG. 5), thus fixing the connected steel wires on the back of the subscreens 11 and realizing connection between the subscreens 11. The elastic force arrangement of the fixing seat 3 does not need any tool and screw, and the connected part of the steel wires may be taken out to replace the subscreen by pushing away the cover plate. Because the steel wires have flexibility, the fixed screen may be folded rationally, and the splicing structure of the steel rope also enables the subscreens 11 to be replaced and dismounted more conveniently, so that the screen is more flexible to use.

In one embodiment of the present invention, the screen 1 comprises: two groups of vertically arranged subscreens 11; the horizontal adjacent side of the two subscreens 11 is also provided with a fixing seat 3 the fixing slot 39 of which is arranged horizontally. The spacing of the horizontally adjacent fixing seats 3 on the two subscreens 11 is matched with the length of the short steel wire 22. The horizontally arranged fixing seat 3 can fix the fixture block 23 at the two ends of the short steel wire 22 into the fixing slot 39. At this time, the size of the fixing slot is matched with the fixture block 23. Moreover, the outside of the fixing slot is provided with a slot opening 391 that can be matched with the short steel wire 22 for insertion; and the horizontal gap between the subscreens 11 is limited by tensioning the two horizontally adjacent subscreens 11 through the short steel wire 22. When in use, the number of the vertical steel rope 2 and the number of the horizontal short steel wire 22 may be set according to the specific weight of the screen. In the embodiment, the back of the subscreens 11 arranged vertically is provided with two vertical steel ropes 2; and the back of the horizontally adjacent subscreens 11 is symmetrically provided with two horizontally arranged short steel wires 22.

Figure 7:
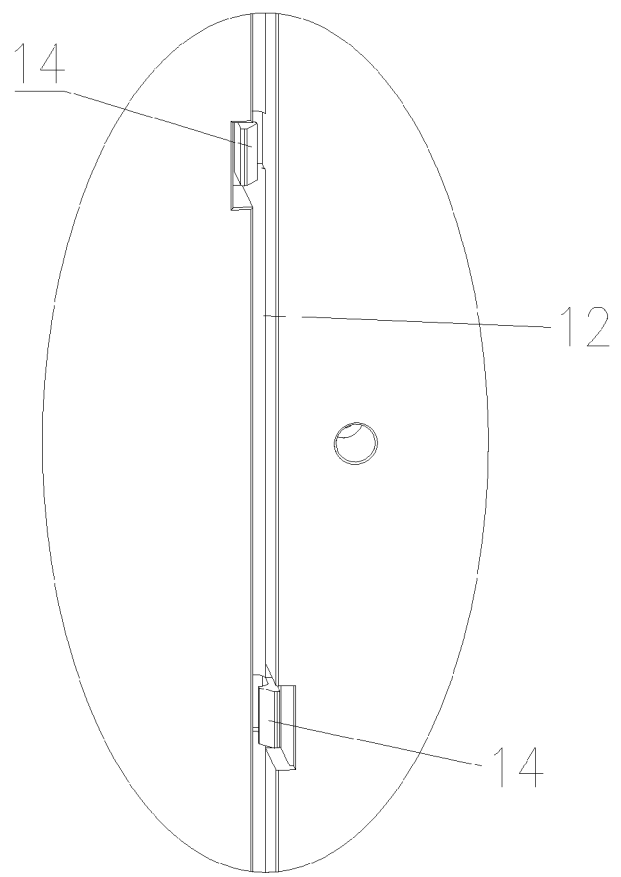
FIG. 7 is a partial enlarged drawing of a wire crimping buckle structure at position A of FIG. 1.

For cabling beauty and screen connection stability, the back of the screen 1 is provided with a cabling channel 12 matched with the shape of the steel rope 2, and an installing slot 13 matched with the shape of the fixing seat 3, which are as shown in FIG. 1 and FIG. 7. The inside of the cabling channel 12 is provided with wire crimping buckles 14 stretching out from one side towards the other side, and the adjacent wire crimping buckles 14 are arranged in the cabling channel 12 towards opposite directions. A groove completely matched with the shape of the steel rope 2 is formed by the cabling channel 12 and the fixing slot 39 of the fixing seat 3. During installation, the steel rope 2 which is connected in series is inserted into the groove, and the opening of the fixing slot 39 is sealed by the cover plate 33, thus being capable of completely fixing the steel rope 2 on the back of the screen, so that the structure is reliable and beautiful in molding.

Figure 8:
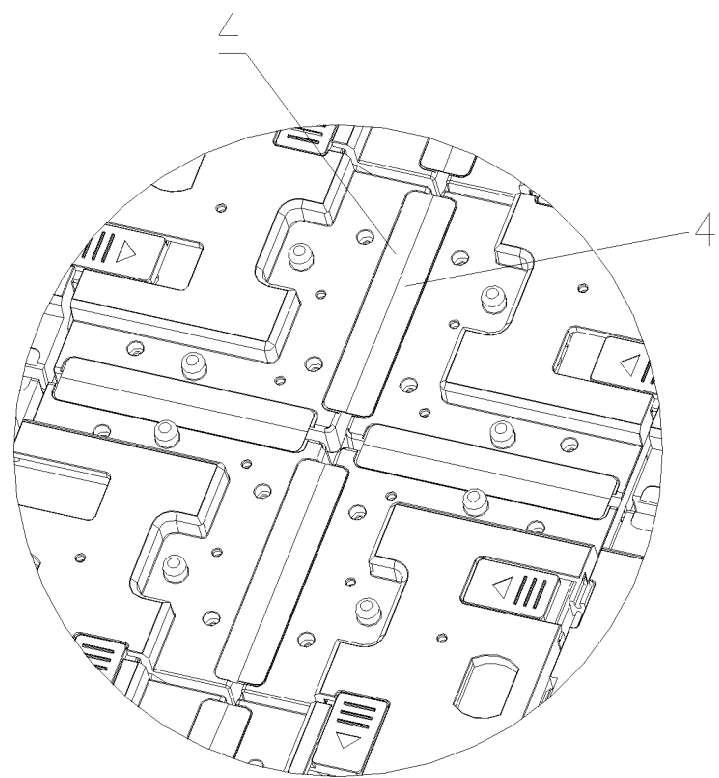
FIG. 8 is a partial enlarged drawing of an EVA foam structure at position B of FIG. 1.

In one embodiment, as shown in FIG. 8, the adjacent sides at the back of the two subscreens 11 are respectively provided with an EVA form 4, wherein the adjacent sides of the two EVA foams 4 are butted against and cover the gap between the two subscreens 11. The EVA foam 4 not only can cover the gap to not transmit light, but also does not affect folding, thus effectively improving the visual effect.

Figure 9:
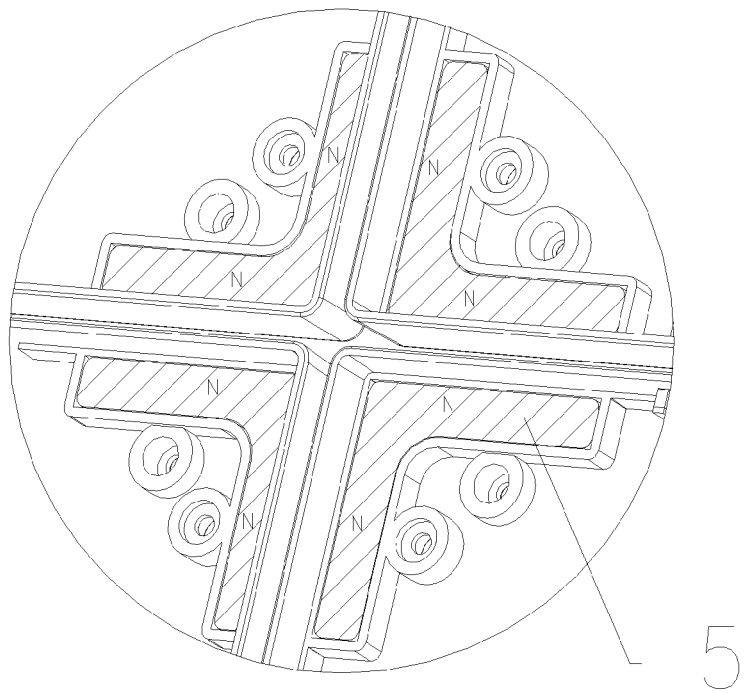
FIG. 9 is a partial enlarged drawing of a magnet structure at position B of FIG. 1.

As shown in FIG. 9, the four corners of the subscreen 11 may be provided with magnets 5. When multiple subscreens 11 on the vertical and longitudinal directions are spliced, the magnets 5 mutually attract, which may prevent the corners of the subscreens 11 from warping and make the surface of the screen flat.

Figure 10:
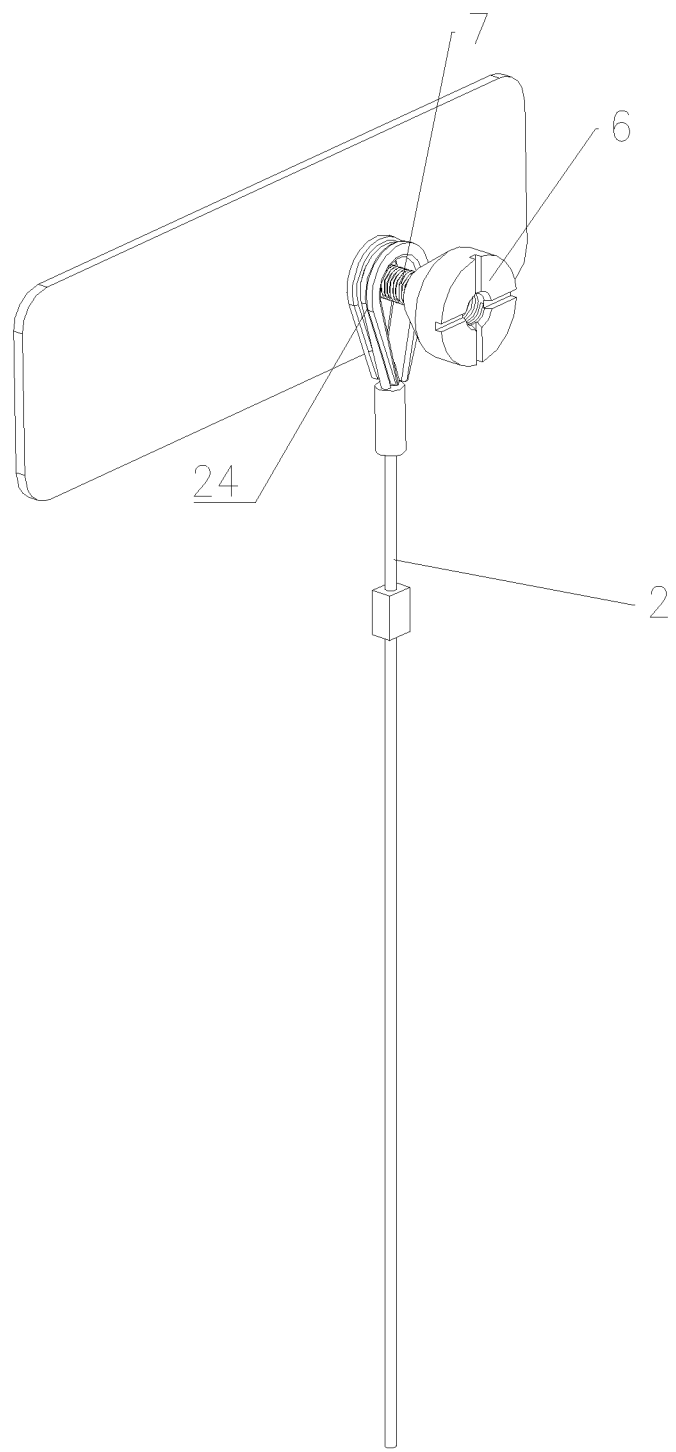
FIG. 10 is a schematic diagram of a process of installing a steel cable and a conical nut.
Figure 11:
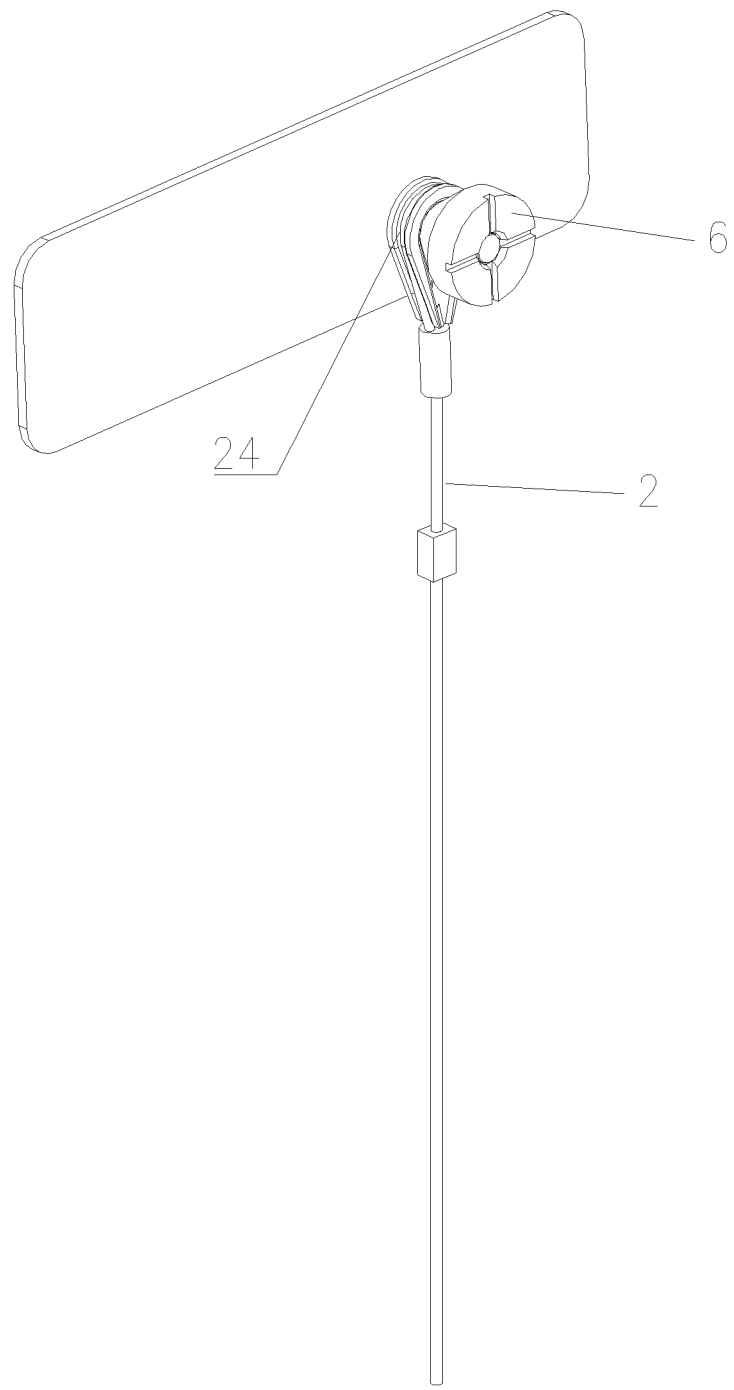
FIG. 11 is a schematic diagram of installing and compacting the steel cable and the conical nut.

As shown in FIG. 10, the top end of the steel cable 2 is provided with a circular ring 24; the circular ring 24 is installed and fixed through a conical nut 6 and a stud 7. A circular nut in the prior art may tightly compresses the circular ring on a fixture; when a stud is not in the center of the circular ring, the screen may be deformed under the tensile force of the steel rope, which is as shown in FIG. 11. In the present invention, the conical surface of the conical nut 6 is adopted to be matched and compressed with the circular ring 24 of the steel rope. When the stud 7 is not in the center of the circular ring 24, the circular ring 24 may rotate by surrounding the conical surface to change the locating position and ensure that the screen is in a correct installation position.

As shown in FIG. 1, plug-in flat cables 8 and welding flat cables 9 used for splicing may further be arranged on the adjacent sides at the back of the subscreens 11, so that the user may flexibly select a connection mode for the flat cables.

The foregoing descriptions are merely preferred embodiments of the present invention, but are not intended to limit the present invention. Any modification, equivalent replacement and improvement figured out within the spirits and principles of the present invention shall all fall within the protection scope of the present invention.

What is claimed is:

1. A precisely spliced foldable LED screen, comprising:
a screen (1), formed by at least one group of subscreens (11) arranged vertically;
a steel cable (2), arranged at the back of the subscreen, comprising: a long steel wire (21) and a short steel wire (22) which are vertically connected in a spacing manner and have the same diameter, wherein the two ends of the long steel wire and the short steel wire are respectively provided with a square fixture block (23); the square fixture block is of a concave shape; the end of the steel wire is fixed on the bottom at one side of the fixture block; the upper part of the fixture block is provided with a through groove; the steel wire may be matched and clamped into the groove; the adjacent ends of the long and short steel wires are mutually and alternatively spliced together through the fixture block; and
fixing seats (3), wherein the fixing seat comprises: a base (31), wherein a square concave hole (34) is arranged on the base, one corner of the concave hole is provided with a convex block (35) having an installing hole, the center at the bottom of the concave hole is provided with a long slot (36), a sliding block (37) is arranged in the sliding slot, and the base is provided with a sliding slot (38) at the two sides of one end of the concave hole; a cover plate (33) which may slide along the sliding slot to cover or open the square concave hole; a spring (32) arranged in the square concave hole of the base, wherein one end of the spring is inserted into the installing hole of the convex block (35), and the other side is connected with the cover plate (33) through a screw and the sliding block (37); a fixing slot (39) arranged at one side of the base and vertical to the sliding direction of the cover plate (33), wherein two slot openings (391) matched with the long and short steel wires are respectively extended out from the two ends of the hole of the fixing slot; and a fixing lug (311) stretching out from the two ends of the base and provided with a screw hole;
the fixing seat (3) is arranged on the upper and lower ends of the back of the subscreen, and the fixing slot (39) of the fixing seat is vertically arranged; the spacing between the upper and lower fixing seats is matched with the length of the long steel wire; the spacing between two vertically adjacent fixing seats on the two subscreens (11) are matched with the length of the short steel wire; the fixture block at the connected part of the long and short steel wires is clamped into the fixing slot (39) and the steel wires stretch out from the slot opening (391).

2. The foldable LED screen according to claim 1, wherein the screen (1) comprises multiple groups of subscreens (11) arranged vertically; the horizontally adjacent sides of each subscreen are also provided with the fixing seat (3) on which the fixing slot (39) is arranged horizontally; the spacing between the horizontally adjacent fixing seats on two subscreens is matched with the length of the short steel wire; and the square fixture block (23) of the short steel wire is matched and clamped into the fixing slot (39).

3. The foldable LED screen according to claim 2, wherein the four corners of the subscreen are respectively provided with magnets.

4. The foldable LED screen according to claim 1, wherein plug-in flat cables capable of matching for splicing are arranged on the adjacent sides at the back of the subscreens; moreover, welding flat cables are also arranged on the adjacent sides at the back of the subscreens.

5. The foldable LED screen according to claim 2, wherein plug-in flat cables capable of matching for splicing are arranged on the adjacent sides at the back of the subscreens; moreover, welding flat cables are also arranged on the adjacent sides at the back of the subscreens.

6. The foldable LED screen according to claim 2, wherein the adjacent sides at the back of the two subscreens are respectively provided with an EVA form, wherein the adjacent sides of the two EVA foams are butted against and cover the gap between the two subscreens.

7. The foldable LED screen according to claim 2, wherein the back of the screen (1) is provided with a cabling channel (12) matched with the shape of the steel cable (2), and an installing slot (13) matched with the shape of the fixing seat (3).

8. The foldable LED screen according to claim 6, wherein the inside of the cabling channel (12) is provided with wire crimping buckles (14) stretching out from one side towards the other side, and the adjacent wire crimping buckles are arranged towards opposite directions.

9. The foldable LED screen according to claim 1, wherein the top end of the steel cable is provided with a circular ring (24); the circular ring is installed and fixed through a conical nut (6) and a stud (7); and the conical surface of the conical nut compresses the circular ring.

* * * * *